United States Patent [19]

Kaiser

[11] 4,045,258

[45] Aug. 30, 1977

[54] METHOD OF MANUFACTURING A SEMICONDUCTOR DEVICE

[75] Inventor: Reinhold Kaiser, Heilbronn-Sontheim, Germany

[73] Assignee: Licentia Patent-Verwaltungs-GmbH, Frankfurt am Main, Germany

[21] Appl. No.: 545,880

[22] Filed: Jan. 31, 1975

[30] Foreign Application Priority Data

Feb. 2, 1974 Germany ............................ 2405067

[51] Int. Cl.² .......................................... H01L 21/22
[52] U.S. Cl. .................................. 148/187; 148/175; 148/188
[58] Field of Search ................ 148/1.5, 175, 186, 187, 148/188

[56] References Cited

U.S. PATENT DOCUMENTS

| 3,328,214 | 6/1967 | Hugle | 148/175 |
| 3,363,760 | 1/1968 | Klein | 148/187 |
| 3,367,115 | 6/1972 | Barson et al. | 148/187 X |
| 3,408,544 | 10/1968 | Teszner | 148/187 X |
| 3,436,282 | 4/1969 | Shoda | 148/187 |
| 3,484,309 | 12/1969 | Gilbert | 148/188 X |
| 3,484,313 | 12/1969 | Tauchi et al. | 148/187 |
| 3,584,266 | 6/1971 | Schilling | 148/187 X |
| 3,697,827 | 10/1972 | Simon | 148/187 X |
| 3,717,507 | 2/1973 | Abe | 148/186 X |

OTHER PUBLICATIONS

Ho et al. "Low-Power Monolithic Storage," IBM Tech. Discl. Bull.," vol. 11, No. 7, Dec. 1968, pp. 867, 868.

*Primary Examiner*—L. Dewayne Rutledge
*Assistant Examiner*—J. M. Davis
*Attorney, Agent, or Firm*—Spencer & Kaye

[57] ABSTRACT

A method of producing a semiconductor arrangement comprises diffusing through a diffusion mask into a semiconductor body a semiconductor region of a first type of conductivity and applying to the semiconductor body a semiconductor region of a second type of conductivity extending to the surface of the semiconductor body at least partially in a region which is caused by the diffusion mask when diffusing the region of the first type of conductivity.

8 Claims, 14 Drawing Figures

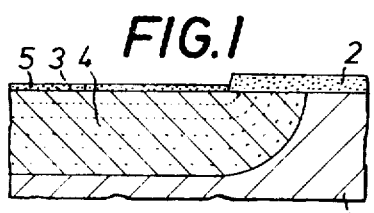
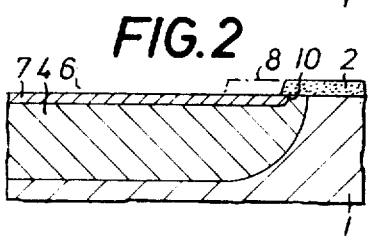
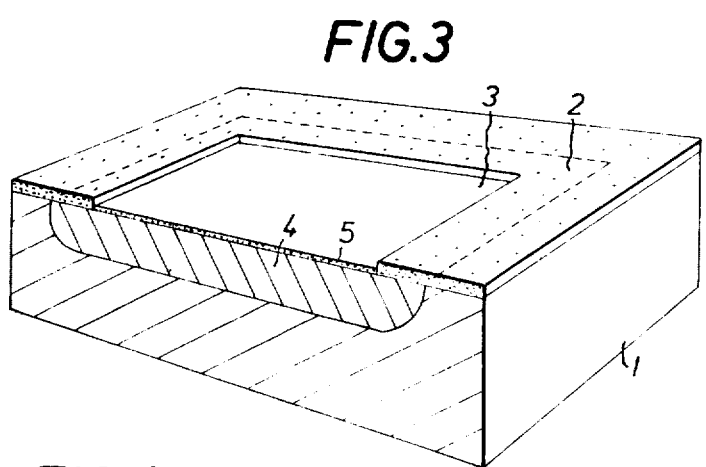
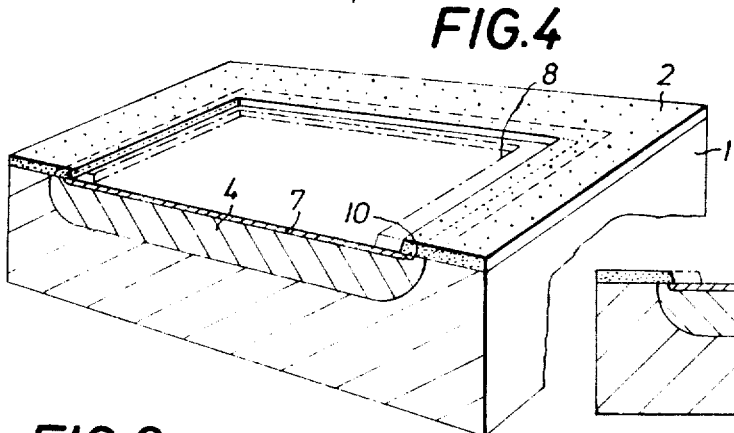
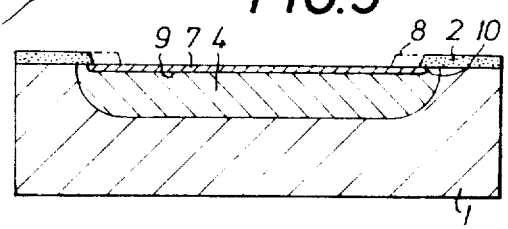
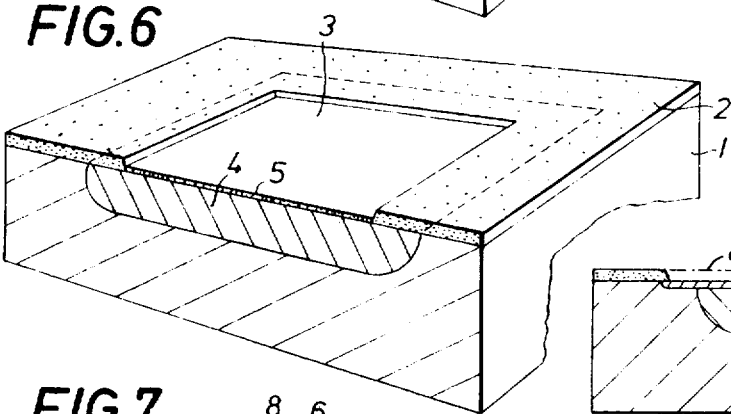
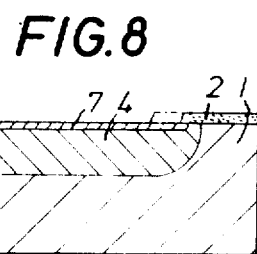
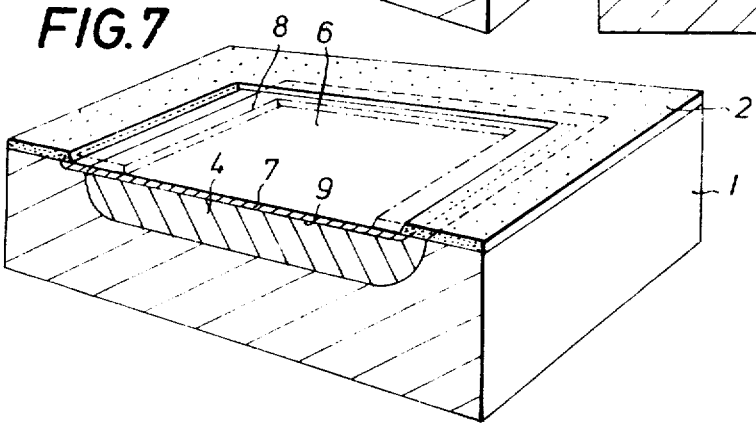

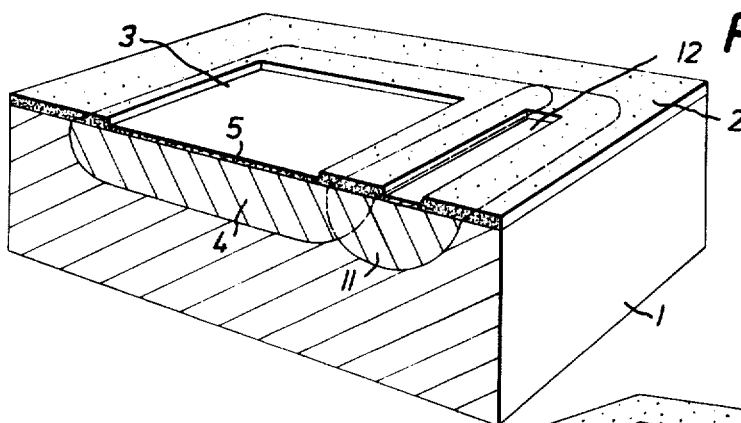
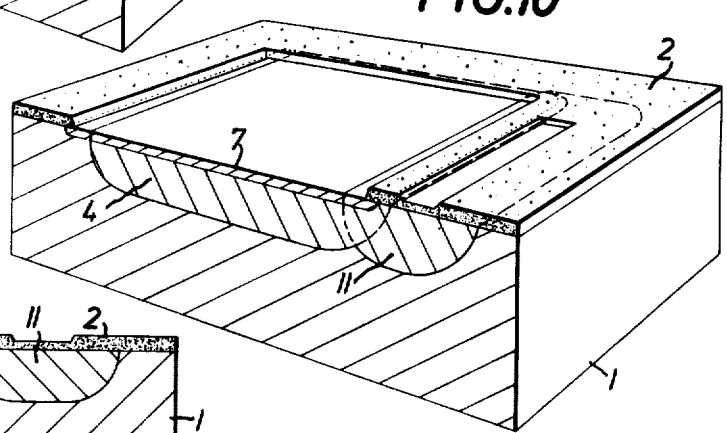
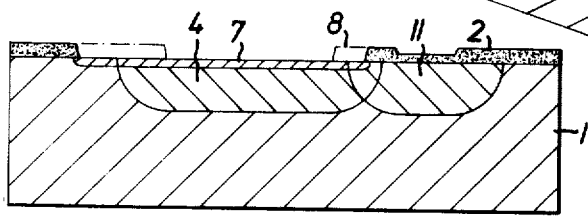
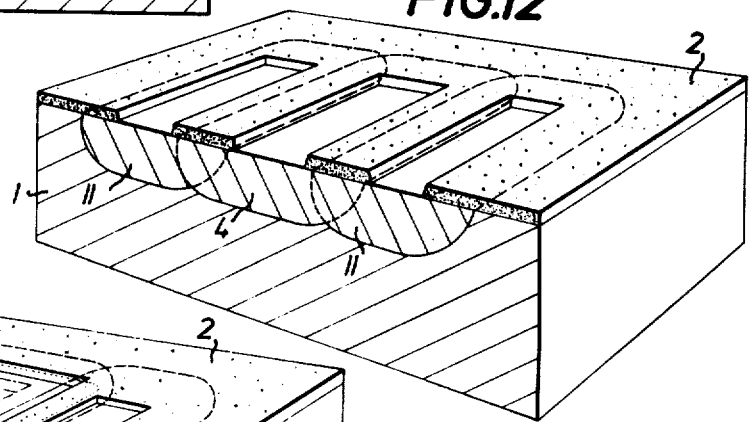
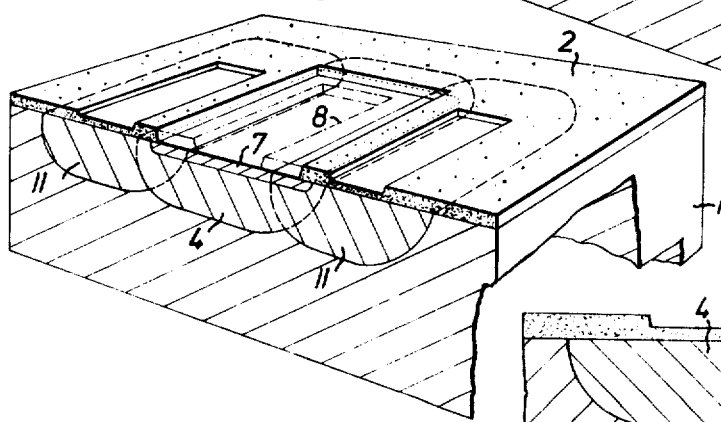
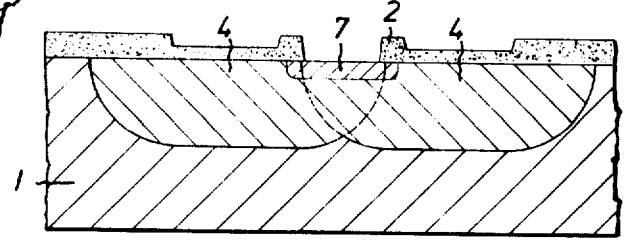

METHOD OF MANUFACTURING A SEMICONDUCTOR DEVICE

BACKGROUND OF THE INVENTION

The invention relates to a method of producing a semiconductor arrangement in which one semiconductor region of a first type of conductivity is diffused into a semiconductor body with the help of the diffusion mask technique.

Such a method is known. In the case of the known method, as is well known, a masking layer which acts so as to arrest diffusion and comprises for example silicon dioxide or silcon nitride, is used as the diffusion mask.

SUMMARY OF THE INVENTION

It is an object of the invention to provide a method which permits the production of a semiconductor arrangement with at least one pn-junction, the blocking properties of which are improved.

According to a first aspect of the invention, there is provided a method for producing a semiconductor arrangement comprising diffusing a semiconductor region a first type of conductivity into a semiconductor body using a diffusion mask and applying to said semiconductor body a semiconductor region of a second type of conductivity extending to the semiconductor surface at least partially in a region covered, during the diffusion of said semiconductor region of the first type of conductivity by said diffusion mask.

According to a second aspect of the invention, there is provided a method of producing a semiconductor arrangement, in which one semiconductor region of a first type of conductivity is diffused into a semiconductor body with the help of the diffusion mask technique, characterized in that a semiconductor region of a second type of conductivity is applied to said semiconductor body in such a manner that a part of said semiconductor region of the second type of conductivity extending to the semiconductor surface occurs at least partially to that region on the semiconductor surface which is covered during the production of the semiconductor region of the first type of conductivity by the masking layer.

BRIEF DESCRIPTION OF THE DRAWINGS

The invention will now be described in greater detail, by way of example, with reference to the drawings in which:

FIG. 1 is a part sectional view of a semiconductor body at a first stage of a first embodiment of the method according to the invention;

FIG. 2 is a view similar to FIG. 1 but showing a second stage of this invention;

FIG. 3 is a part perspective view of the semiconductor body of FIG. 1;

FIG. 4 is a view similar to FIG. 3 but corresponding to FIG. 2;

FIG. 5 is a view similar to FIG. 2 but showing the full extent of the diffused regions;

FIG. 6 is a part perspective view similar to FIG. 3 but showing a first stage of a second embodiment of the method;

FIG. 7 is a view similar to FIG. 6 but showing a second stage of this embodiment;

FIG. 8 is a sectional view of the semi-conductor body corresponding to FIG. 7;

FIG. 9 is a part perspective view similar to FIG. 3 but showing a first stage of a third embodiment of the method;

FIG. 10 is a view similar to FIG. 9, but showing a second stage of this embodiment;

FIG. 11 is a sectional view of the semiconductor body corresponding to FIG. 10;

FIG. 12 is a part perspective view similar to FIG. 3 but showing a first stage of a fourth embodiment of the method;

FIG. 13 is a view similar to FIG. 12 but showing a second stage of this embodiment, and FIG. 14 is a sectional view of a semiconductor body showing a second stage of a fifth embodiment of the method.

DESCRIPTION OF THE PREFERRED EMBODIMENTS

Basically, the invention proposes, in the case of a method of the type mentioned above, that a semiconductor region of the second type of conductivity is formed in the semiconductor body in such a manner that the part of this semiconductor region of the second type of conductivity, which region extends towards the semiconductor surface, occurs at least partially in that region on the semiconductor surface which is covered, during the production of the semiconductor region of the first type of conductivity, by the masking layer.

The semiconductor region of the second type of conductivity is either embedded completely in the semiconductor region of the first type of conductivity or constructed in such a manner that it extends at least on one side or partially beyond the semiconductor region of the first type of conductivity into the semiconductor body. If the semiconductor region of the second type of conductivity extends beyond the semiconductor region of the first type of conductivity into the semiconductor body, the semiconductor region of the second type of conductivity can be contacted in a simple manner by attaching an electrode to the semiconductor body. This of course presupposes that the semiconductor body has the same type of conductivity as the semiconductor region of the second type of conductivity and thus of the second type of conductivity.

The semiconductor region of the first type of conductivity and the semiconductor region of the second type of conductivity are used, with their pn-junction located therebetween, for example as a diode or a capacitance. In this case, the semiconductor body preferably has the second type of conductivity. However, there also exists the possibility that the semiconductor body in this case has the first type of conductivity.

The semiconductor region of the first type of conductivity can also be used for example as a base region of a transistor. In this case, the semiconductor region of the second type of conductivity is preferably the emitter region of the transistor. The collector region of the transistor is in this case preferably formed by the semiconductor body.

The semiconductor region of the second type of conductivity is preferably thinner than the semiconductor region of the first type of conductivity. The semiconductor region of the second type of conductivity is produced preferably similarily to the semiconductor region of the first type of conductivity by diffusion. The diffusion window for producing the semiconductor region of the second type of conductivity by diffusion is made preferably larger than the diffusion window for producing the semiconductor region of the first type of conductivity.

In order to facilitate the contacting of the semiconductor region of the first type of conductivity, a further second region of the first type of conductivity may be formed in the semiconductor body, which second region overlaps or at least touches the first region of the first type of conductivity. This second semiconductor region of the first type of conductivity is arranged laterally from the first semiconductor region of the first type of conductivity. The second semiconductor region of the first type of conductivity is diffused into the semiconductor body, preferably together with the first semiconductor region of the first type of conductivity. Instead of only one second semiconductor region of the first type of conductivity, of course, also several second regions of the first type of conductivity can be provided or there also exists the possibility of annularly surrounding the first semiconductor region of the first type of conductivity by a second semiconductor region of the first type of conductivity.

Referring now to the drawings, FIGS. 1 and 2 and FIGS. 3 and 4 corresponding thereto have as their subject the production of two semiconductor regions of opposite types of conductivity in a semiconductor body according to the invention. In the production of two semiconductor regions of opposite types of conductivity in a semiconductor body according to the invention, one starts, for example in accordance with FIG. 1 and FIG. 3, corresponding thereto, from a semiconductor body 1 and provides one surface side of the semiconductor body 1 with a diffusion-arresting insulating layer 2, which comprises, for example, silicon dioxide or silicon nitride. Subsequently, an opening 3 is made in the insulating layer 2, which opening serves as a diffusion window. A semiconductor region 4 of the first type of conductivity is diffused into the semiconductor body 1 through this diffusion window 3. If the diffusion of the semiconductor region 4 is effected in an oxidizing atmosphere, a second insulating layer 5 results in the diffusion window during the diffusion.

To produce the semiconductor region of the second type of conductivity, a diffusion window 6, which is greater than diffusion window 3 for the production of the semiconductor region 4 of the first type of conductivity, is made in accordance with FIGS. 2 and 4 in the insulating layers 5 and 2. Subsequently, the semiconductor region 7 of the second type of conductivity in accordance with FIGS. 2 and 4 is diffused into the semiconductor body 1 or in the semiconductor region 4 through this diffusion window 6. What is particularly remarkable is the fact that in the case of the method according to the invention, the diffusion window 6 for producing the thinner semiconductor region 7 of the second type of conductivity is greater than the diffusion window 3 for the production of the thicker semiconductor region 4 of the first type of conductivity.

FIG. 5 shows once more a semiconductor body 1 with the diffused-in semiconductor regions 4 and 7 in section. The chain lines 8 in FIGS. 2, 4 and 5 indicate the original dimensions of the first insulating layer 2 after the production of a first diffusion window 3. The semiconductor body 1 has, for example, the first or the second type of conductivity. The pn-junction 9 results, in accordance with FIG. 5, between the two semiconductor regions 4 and 7 of the first and second type of conductivity. The semiconductor body 1 comprises, for example, silicon. The semiconductor arrangement of FIGS. 2 or 4 and 5 can be used as a diode or as a transistor. When using it as a transistor, the semiconductor body 1 forms the collector region of the transistor, whereas the base region is formed by the semiconductor region 4 and the emitter region is formed by the semiconductor region 7. When being used as a diode, the semiconductor body 1 generally has the opposite type of conductivity to the semiconductor region 4, which is the case above all in integrated circuits, yet the semiconductor body 1, when used as a diode, can also have the same type of conductivity as the semiconductor region 4. The diode itself is formed by the two semiconductor regions 4 and 7 of opposite types of conductivity with the pn-junction 9 located therebetween.

In the case of the exemplary embodiment described, the condition of the invention is fulfilled that the part 10 of the semiconductor region 7 of the second type of conductivity, extending towards the semiconductor surface, occurs at the semiconductor surface in that region of the semiconductor surface which is covered by the first insulating layer 2 in the production of the semiconductor region 4 of the first type of conductivity.

FIGS. 6 to 8 show a further embodiment of the invention. FIG. 6 corresponds to FIG. 3 of the first embodiment, that is firstly, again a semiconductor region 4 of the first type of conductivity is diffused into a semiconductor body 1 through an opening 3 in an insulating layer 2 located on the semiconductor surface. If this diffusion takes place in an oxidizing atmosphere, then again a second insulating layer 5 results, which covers the diffused-in semiconductor region 4 of the first type of conductivity in the region of the diffusion window 3.

In accordance with FIG. 7, a further semiconductor region is diffused into the semiconductor body 1 after the production of the semiconductor region 4, that is the semiconductor region 7 of the second type of conductivity, which forms a pn-junction 9 with the semiconductor region 4 of the first type of conductivity. The diffusion of the semiconductor region 7, which is thinner than the semiconductor region 4, is effected in accordance with FIGS. 7 and 8 through a diffusion window 6, which is greater than the diffusion window 3 for the production of the semiconductor region 4 of the first type of conductivity. The diffusion window 6 is so arranged that the semiconductor region 7 comes to lie laterally under regions of the original insulating layer 2. The chain lines 8 in FIGS. 7 and 8 again show, as in the first embodiment, the original boundary of the first insulating layer 2 after the production of the first diffusion window 3. The semiconductor region 7 of the second type of conductivity is further so arranged in the exemplary embodiment of FIGS. 7 and 8 that it projectes on one side beyond the semiconductor region 4 of the first type of conductivity and extends into the semiconductor body 1. If the type of conductivity of the semiconductor body 1 coincides with the semiconductor region 7, then there exists in this case the possibility of contacting the semiconductor region 7 by contacting the semiconductor body 1. The semiconductor region 7 can, of course, also extend on all sides into the semiconductor body 1 beyond the semiconductor region 4. The arrangement of FIGS. 7 and 8 can be used for example as a diode or as a capacitance.

FIGS. 9 to 11 show an embodiment of the invention which differs from the embodiment of FIGS. 7 and 8 in that further additionally a semiconductor region 11 of the type of conductivity of the semiconductor region 4 and thus of the first type of conductivity is applied to the semiconductor body 1, which semiconductor region 11 overlaps or at least touches the semiconductor region 4 and serves for contacting the semiconductor region 4. This semiconductor region 11 is diffused into the semiconductor body 1, according to FIG. 9, for example at the same time as the semiconductor region 4, that is to say, through the diffusion window 12. If this diffusion takes place in an oxidizing atmosphere, then a second insulating layer 5 is also formed in the diffusion window 12. FIG. 11 shows a semiconductor arrangement once more in section. The chain lines 8 again show the original dimensions of the first insulating layer 2 provided with the first diffusion window 3.

FIGS. 12 and 13 show an exemplary embodiment of the invention in which two semiconductor regions 11 of the type of conductivity of the semiconductor region 4 and thus of the first type of conductivity are provided on both sides of the semiconductor region 4 and overlap the semiconductor region 4. These semiconductor regions 11, which perferably are diffused into the semiconductor body 1, simultaneously with the semiconductor region 4, again have, as in the preceding embodiment, the function of connection regions, to which are attached electrodes for contacting the semiconductor region 4.

In FIG. 13, the semiconductor region 7 is produced in the semiconductor region 4. In the embodiment of FIG. 13, the semiconductor region 7 of the second type of conductivity is located completely within the semiconductor region 4 of the first type of conductivity, and thus does not project beyond the semiconductor region 4. Also in the case of the arrangement of FIG. 13, the requirement is again fulfilled that the semiconductor region 7 terminates laterally under the original insulating layer 2. The diffusion window for producing the semiconductor region 7 of the second type of conductivity is, in the embodiment of FIG. 13, also greater than the diffusion window for producing the semiconductor region 4 of the first type of conductivity, as the chain lines 8 indicate. The arrangement of FIG. 13 can again be used, for example, as a diode, as a capacitance or as a transistor.

Finally, FIG. 14 shows yet another exemplary embodiment of the invention in which not only one semiconductor region 4 of the first type of conductivity is present, but two semiconductor regions 4 of the first type of conductivity, which are diffused into the semiconductor body 1 in such a manner that they overlap each other. In this case, the overlapping region 13 results. The two semiconductor regions 4 of FIG. 14 are at best called the first semiconductor regions of the first type of conductivity, since neither of these two semiconductor regions is exchangeable with the second semiconductor region 11 of the first type of conductivity, provided essentially only for contacting.

The semiconductivity region 7 is diffused into the overlapping region 13 in the case of the arrangement of FIG. 14, that is in accordance with the invention in such a manner that the edge of the semiconductor region 7, which extends up to the semiconductor surface, comes to lie underneath the insulating layer 2, which was already present on the semiconductor surface during the diffusion of the semiconductor regions 4. The semiconductor arrangement of FIG. 14 can also be used for example as a diode, as a capacitance or as a transistor.

It will be understood that the above description of the present invention is susceptible to various modifications changes and adaptations.

What is claimed is:

1. In a method of producing a semiconductor arrangement including applying a diffusion masking layer to one surface of a semiconductor body, forming a first semiconductor region of a first type of conductivity by opening a first diffusion window in said masking layer and diffusing said first semiconductor region into the semiconductor body via said window, forming a second semiconductor region of a second type of conductivity completely within said first semiconductor region so that the p-n junction between said first and second semiconductor regions extends to a portion of the semiconductor surface which is covered by said diffusion masking layer prior to and during said step of diffusing said first semiconductor region of the first type of conductivity, the improvement wherein said step of forming a second semiconductor region of the second type of conductivity comprises opening a second diffusion window in said masking layer which is greater than said first diffusion window for producing said semiconductor region of the first type of conductivity, and diffusing said second semiconductor region of the second type of conductivity into said first semiconductor region via said second diffusion window so that said second semiconductor region of the second type of conductivity is substantially thinner than said first semiconductor region of the first type of conductivity.

2. A method as defined in claim 1, wherein said semiconductor body has the same type of conductivity as said second semiconductor region of the second type of conductivity.

3. A method as defined in claim 1 wherein said semiconductor body has the first type of conductivity.

4. A method as defined in claim 1 further comprising forming a further semiconductor region of the first type of conductivity in said semiconductor body so that said further region overlaps or at least touches said first semiconductor region of the first type of conductivity.

5. A method as defined in claim 4 further and comprising arranging said further semiconductor region of the first type of conductivity laterally of said first semiconductor region of the first type of conductivity.

6. A method as defined in claim 4 further comprising attaching an electrode for contacting said first semiconductor region of the first type of conductivity to said further semiconductor region of the first type of conductivity.

7. A method as defined in claim 4 further and comprising providing several of said further semiconductor regions of the first type of conductivity.

8. A method as defined in clain 4 further and comprising arranging said further semiconductor region of the first type of conductivity annularly surrounding said first semiconductor region of the first type of conductivity.

* * * * *